United States Patent
Luthra

(10) Patent No.: US 7,729,155 B2
(45) Date of Patent: Jun. 1, 2010

(54) HIGH SPEED, LOW POWER, LOW LEAKAGE READ ONLY MEMORY

(75) Inventor: Yogesh Luthra, Ghaziabad (IN)

(73) Assignee: STMicroelectronics PVT. Ltd., Uttar Pradesh (IN)

( * ) Notice: Subject to any disclaimer, the term of this patent is extended or adjusted under 35 U.S.C. 154(b) by 250 days.

(21) Appl. No.: 11/648,105

(22) Filed: Dec. 29, 2006

(65) Prior Publication Data
US 2007/0183250 A1 Aug. 9, 2007

(30) Foreign Application Priority Data
Dec. 30, 2005 (IN) .................. 3534/DEL/2005

(51) Int. Cl.
*G11C 17/00* (2006.01)
*G11C 11/34* (2006.01)
(52) U.S. Cl. .................. 365/94; 365/103; 365/104; 365/185.16
(58) Field of Classification Search .................. 365/94, 365/103, 104, 185.16
See application file for complete search history.

(56) References Cited
U.S. PATENT DOCUMENTS

| | | | | |
|---|---|---|---|---|
| 4,583,201 A * | 4/1986 | Bertin et al. | .................. | 365/104 |
| 4,661,926 A * | 4/1987 | Lee | .................. | 365/104 |
| 4,811,301 A * | 3/1989 | Houston | .................. | 365/104 |
| 5,031,149 A * | 7/1991 | Matsumoto et al. | .................. | 365/104 |
| 5,323,342 A * | 6/1994 | Wada et al. | .................. | 365/104 |
| 6,636,434 B2 * | 10/2003 | Poullet | .................. | 365/94 |
| 6,831,851 B2 * | 12/2004 | Jong et al. | .................. | 365/104 |
| 6,847,577 B2 * | 1/2005 | Ishiguro | .................. | 365/104 |
| 6,867,995 B2 * | 3/2005 | Lee et al. | .................. | 365/94 |
| 6,975,528 B2 * | 12/2005 | Do | .................. | 365/94 |
| 6,980,456 B2 * | 12/2005 | Chen et al. | .................. | 365/104 |
| 7,154,765 B1 * | 12/2006 | Chen | .................. | 365/94 |
| 7,161,824 B2 * | 1/2007 | Martelloni et al. | .................. | 365/94 |
| 7,190,605 B1 * | 3/2007 | Richter et al. | .................. | 365/94 |
| 7,379,318 B2 * | 5/2008 | Yamauchi | .................. | 365/104 |

\* cited by examiner

Primary Examiner—Trong Phan

(57) ABSTRACT

A read only memory (ROM) for providing a high operational speed with reduced leakage and low power consumption. The read only memory (ROM) includes multiple bit lines, multiple word lines, multiple column select lines and these lines are operatively coupled with multiple transistors. The arrangement of the ROM is such that the word line of a selected row is pulled down to a ground voltage (Vgnd). Non-selected word lines are kept at a supply voltage VDD to ensure that unwanted rows will not have any sub-threshold current (as Vds=0). So during read "1" operation (that is when bit line (BL) is high) load cells would not leak unnecessarily. Thus the ROM achieves a high operational speed with reduced leakage and low power consumption.

20 Claims, 4 Drawing Sheets

HIGH SPEED, LOW POWER, LOW LEAKAGE READ ONLY MEMORY

CROSS-REFERENCE TO RELATED APPLICATIONS

The present application is related to Indian Patent Application No. 3534/Del/2005, filed Dec. 30, 2005, entitled "HIGH SPEED, LOW POWER, LOW LEAKAGE READ ONLY MEMORY". Indian Patent Application No. 3534/Del/2005 is assigned to the assignee of the present application and is hereby incorporated by reference into the present disclosure as if fully set forth herein. The present application hereby claims priority under 35 U.S.C. §119(a) to Indian Patent Application No. 3534/Del/2005.

TECHNICAL FIELD

The present disclosure relates to read only memories (ROMs), and more particularly to ROMs having high operational speeds.

BACKGROUND

Semiconductor memory devices have undergone various design changes in terms of package density, operating speed, or power/current dissipation. Many devices, such as microprocessors, or other related devices include onboard memory which contains one or more read only memory (ROM) cells.

ROM circuits are generally composed of memory elements disposed in rows or word lines and columns or bit lines. A particular word in memory is generally addressed by energizing the row or word line corresponding to the desired word while also energizing the columns of bit lines for all of the bits corresponding to the addressed word. The read only memory circuits (ROM) are widely used in Basic Input/Output System (BIOS) type of systems, where the code hard coded in it will be read at the start of some operation. After that it will just be a leaky component in a system. Hence, low-leakage and low-power consumption are major goals of a ROM designing.

There are schemes that can reduce static leakage and dynamic power consumption of bit lines like selectively precharge bit lines of a selected column. But the ROM memory cell being very dense still gives rise to cross talks, leakage of load transistors within same column, VDD noise to a sense amplifier, etc. These problems give rise to a limited operating speed with unbalanced latching problems. Since bit lines (BLs) are in close proximity, there is a heavy coupling between adjacent BLs. If a cell in an unselected column is programmed as zero, it will couple to an adjacent BL. If this adjacent BL is needed to be kept high (for bit '1') and is to be sensed, then some margin has to be kept in an unbalanced sense amplifier. The leakage of load resistance is another concern for ROM as memory cells are of minimum length, and hence sub-threshold leakage and its deviation are very high.

There is therefore a need for ROMs that improve operational speed while providing power and leakage benefits.

SUMMARY

It is an object of the present disclosure to provide a read only memory (ROM) having a high operational speed with reduced leakage and low power consumption.

In one embodiment, the present disclosure provides a read only memory (ROM) having high operational speed with reduced leakage and low power consumption. The ROM includes a plurality of bit lines, a plurality of word lines and a plurality of column select lines. The ROM also includes a plurality of transistors operatively coupled to the bit lines, the word lines and the column select lines. Each one of the transistors includes a source terminal connected to a selected one of the word lines. Each one of the transistors also includes a drain terminal connected to a selected one of the bit lines and a gate terminal connected to a selected one of the column select lines. The word line is connected to a ground voltage and the column select line is connected to a supply voltage.

In another embodiment, the present disclosure provides a method of building a read only memory (ROM) having a high operational speed with reduced leakage and low power consumption. The method includes coupling a plurality of transistors to a plurality of word lines, a plurality of bit lines and a plurality of column select lines in the ROM to reduce one or more cross talks. The method also includes connecting one of the word lines to a source of a selected one of the transistors. The method also includes connecting one of the bit lines to a drain of the selected transistor and connecting one of the column select lines to a gate of the selected transistor. The word line is connected to a ground voltage and the column select line is connected to a supply voltage.

In still another embodiment, the present disclosure provides a read only memory (ROM). The ROM includes a plurality of bit lines, a plurality of word lines, a plurality of column select lines, and a plurality of transistors operatively coupled to the bit lines, the word lines and the column select lines. Each one of the transistors have a source terminal connected to a selected one of the word lines, a drain terminal connected to a selected one of the bit lines, a gate terminal connected to a selected one of the column select lines. The word line is connected to a ground voltage and the column select line is connected to a supply voltage to provide high operational speed with reduced leakage and low power consumption.

Other technical features may be readily apparent to one skilled in the art from the following figures, descriptions and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Figure 1:
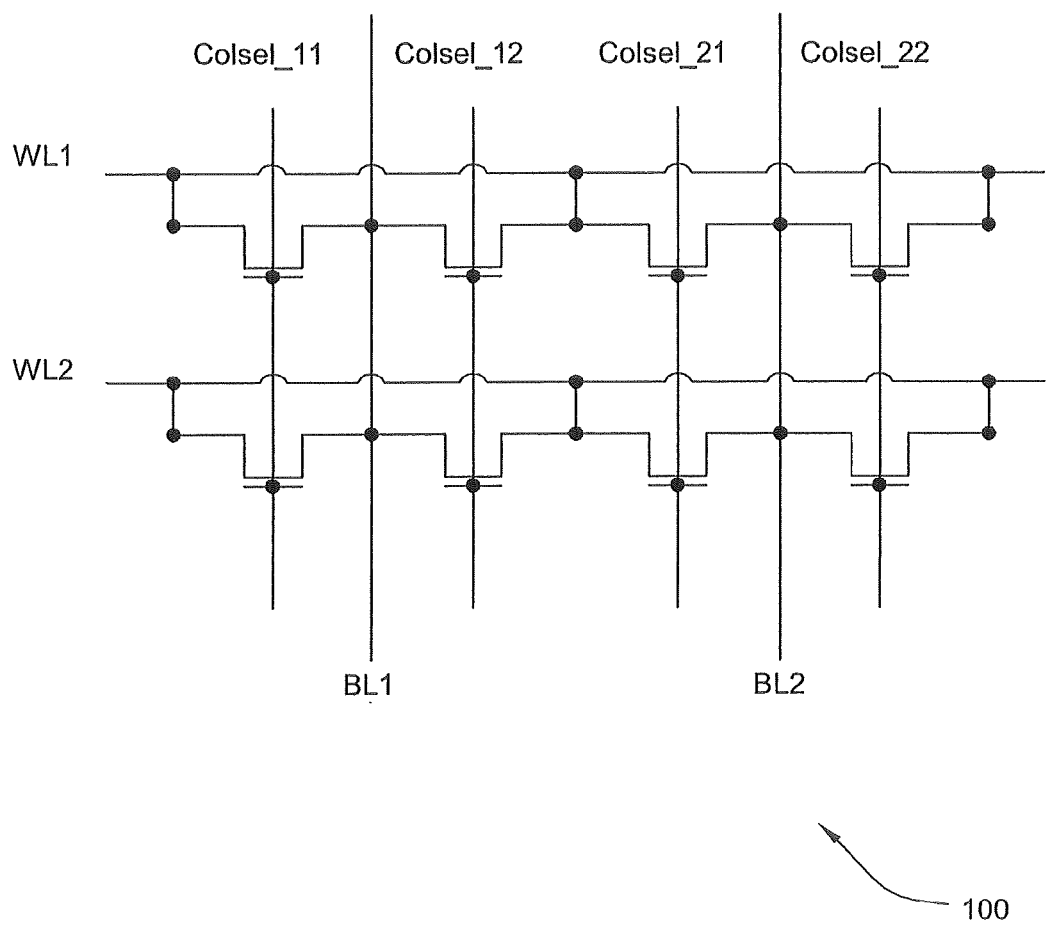
FIG. 1 illustrates a read only memory (ROM) according to one embodiment of the present disclosure.

FIG. 1 illustrates a read only memory (ROM) 100 having a high operational speed with reduced leakage and low power consumption according to one embodiment of the present disclosure. ROM 100 includes multiple bit lines (BLs) including BL1 and BL2, multiple word lines (WLs) including WL1 and WL2, multiple column select lines (Colsel) including Colsel_11, Colsel_12, Colsel_21, and Colsel_22, and multiple transistors. The transistors are operatively coupled to the bit lines, the word lines and the column select lines. A source terminal of the transistors is connected to a word line, a drain terminal is connected to a bit line and a gate terminal is connected to a column select line. In an embodiment of the present disclosure the transistors are metal oxide semiconductor (MOS) transistors.

The working of the ROM is such that the word line of a selected row is pulled down to a ground voltage (Vgnd). Non-selected word lines are kept at a supply voltage VDD. This ensures that unwanted rows will not have any subthreshold current, as Vds=0. So during read 1 (that is when BL is high) load cells would not leak unnecessarily. Hence the margin that had to be kept due to leakage and its variation is not required here.

Activating only a particular column by charging a selected column select line to the supply voltage VDD in order to enable a bit line BL to discharge through the ground created from a word line WL. Rest of the column select lines (i.e., gates of memory cells) are connected to a ground voltage GND. So the bit lines BLs in other columns, not intended to be read, would not discharge. This provides a selective reading of a column. This reduces load on the word line WL, as the word line WL does not have to discharge unwanted columns since memory cells in those columns are in an off state.

Adjacent bit lines BLs can be used as inputs to an unbalanced latch type sense amplifier. However, a switch has to be used to route the selected bit lines BLs on to a drain of a weaker NMOS of the unbalanced sense amplifier. This makes the unbalanced sense amplifier more noise immune as none of the two nodes of the sense amplifier are tied to the supply voltage VDD. These adjacent bit lines BLs can be referred to as a reference bit line BL_ref.

However, use of the adjacent bit lines BLs in a ROM, where a word line WL is connected to gate terminals of all transistors in a row, is not feasible. This is because the discharging of a reference bit line BL depends on programming of a cell. But in an embodiment of the present disclosure, since the bit line BL in an adjacent column is from a set of the bit lines BLs of a multiplexer and unselected columns of the multiplexer have gates at the ground voltage GND, so an adjacent bit line BL does not discharge irrespective of its programming.

Figure 2:
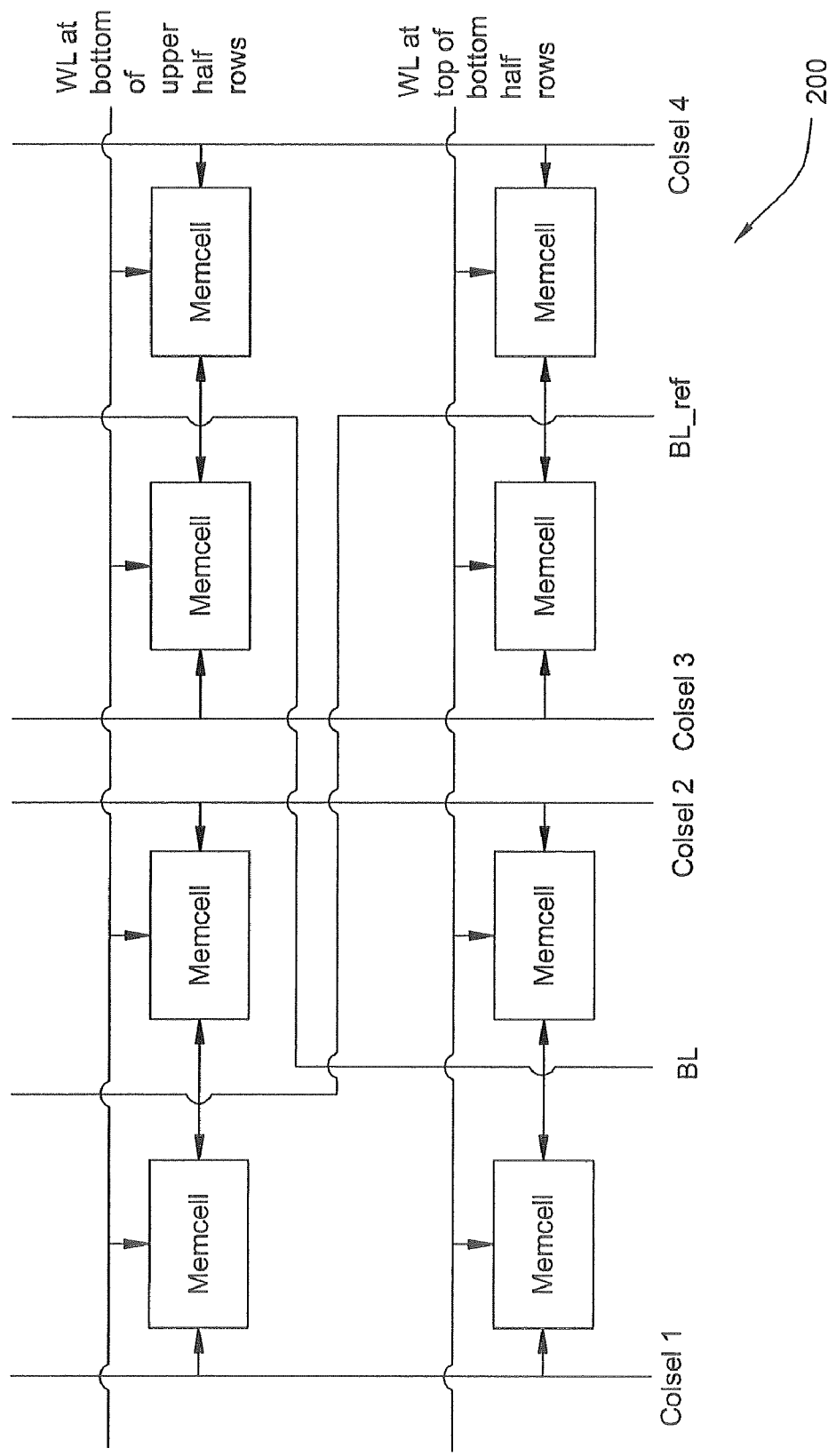
FIG. 2 illustrates a block diagram of a read only memory (ROM) according to one embodiment of the present disclosure.

FIG. 2 illustrates a block diagram 200 of a read only memory (ROM) according to an embodiment of the present disclosure. Block diagram 200 includes memory cells Memcell coupled to word lines WL, bit lines BL and BL_ref and column select lines Colsel1, Colsel2, Colsel3, and Colsel4. The column select lines are in Metal 3, but couple the bit lines BLs due to a gate-drain overlap capacitance. This can be avoided by swapping a bit line BL, that is being read, and the bit line BL_ref used as a reference after half rows. In swapping operation, the bit line is provided as a read bit line for a first half row and a reference bit line for a second half row to reduce coupling and thereby, enhancing operational speed.

The word line is provided at bottom during the first half row and the word line is provided at top during the second half row. The coupling is reduced by 50% in the bit line BL being read, as well as increases potential of reference bit line BL_ref to that of bit line BL being read. Hence, imbalance between the selected bit line BL and a reference bit line BL_ref is eliminated. Since bit lines BLs are swapped after half rows, some logic has to be incorporated in input/output IO to check whether reading is done in an upper half of a core or in a lower half.

Figure 3:
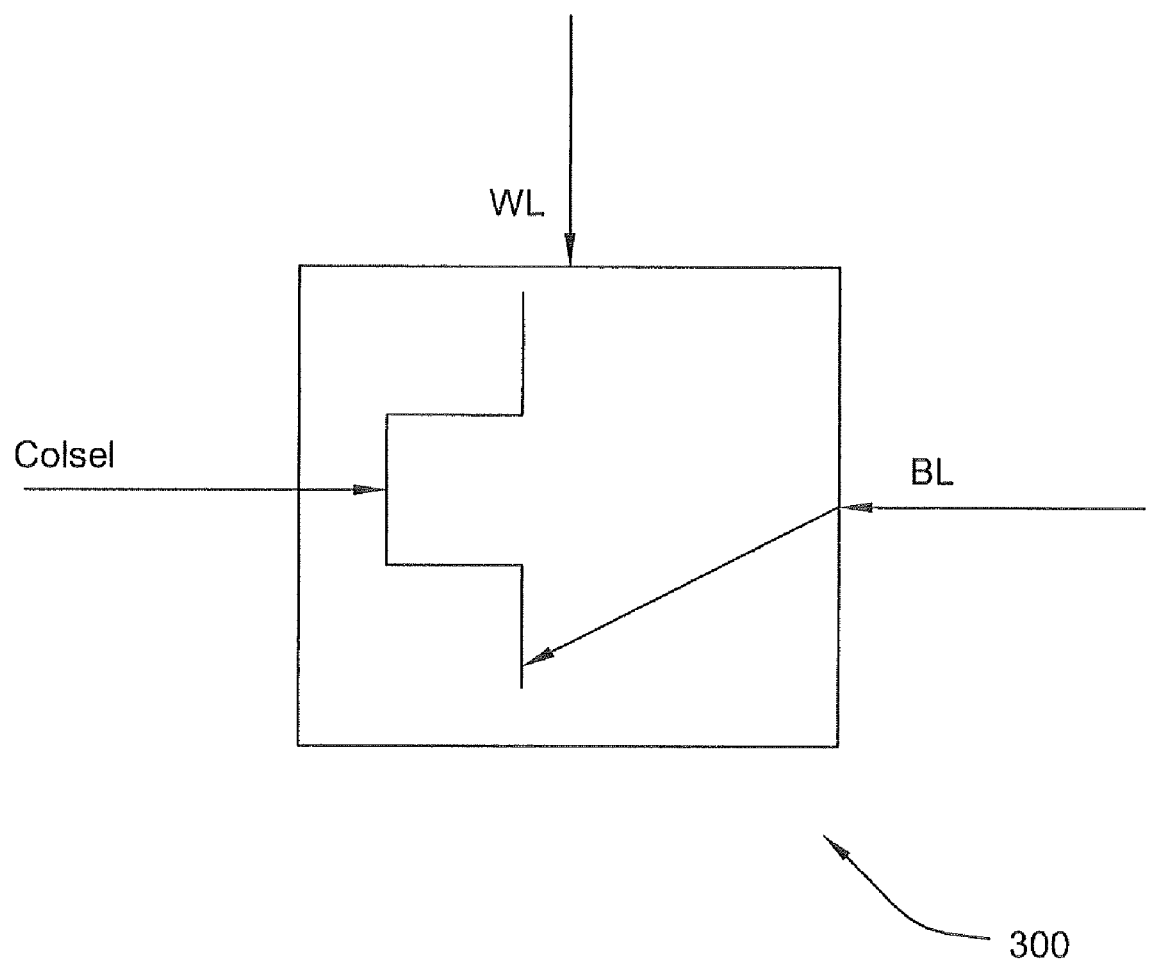
FIG. 3 illustrates a diagram of a memory cell block according to one embodiment of the present disclosure.

FIG. 3 illustrates a diagram of a memory cell 300 according to one embodiment of the present disclosure. Memory cell 300 includes a transistor connected to a word line, a bit line and a column select line. A source terminal of the transistor is connected to a word line WL, a drain terminal is connected to a bit line BL and a gate terminal is connected to a column select line Colsel.

Figure 4:
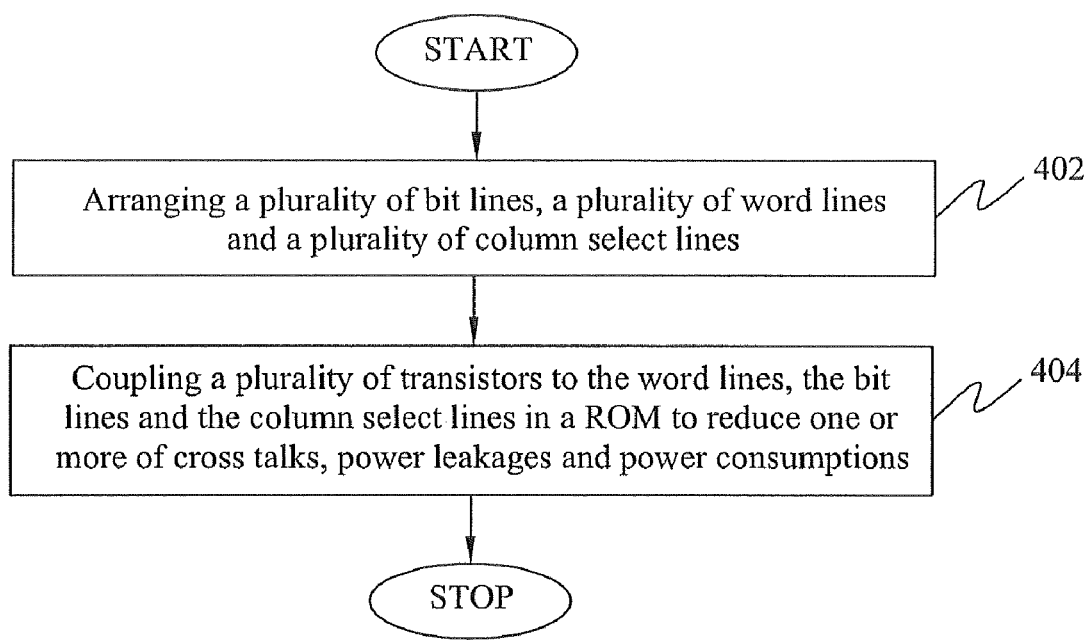
FIG. 4 illustrates a flow diagram for a method for providing a read only memory (ROM) according to one embodiment of the present disclosure.

FIG. 4 illustrates a flow diagram of a method for providing a read only memory (ROM) having a high operational speed with reduced leakage and low power consumption according to one embodiment of the present disclosure. At step 402, a plurality of bit lines, a plurality of word lines and a plurality of column select lines are arranged. At step 404, a plurality of transistors are coupled to the word lines, the bit lines and the column select lines in the ROM to reduce one or more of cross talks, power leakages and power consumption.

In addition to high operational speed, reduced leakage and low power consumption, one embodiment of the present disclosure offers several advantages. First, the present disclosure eliminates discharging of adjacent bit lines (BLs) as the adjacent bit lines (BLs) are not coupled. Second, the memory cells do not have sub-threshold current during read "1" operation. Hence, the sense amplifier need not have so much unbalance to take care of the sub-threshold leakage and coupling. Third, power is saved as only the selected column select line is charged. As the unselected column select lines are grounded, they will not be discharged. Due to this, the strength requirement of transistor that sinks charge from BL will not be very high. Fourth, static leakage of the memory cell is negligible. Fifth, adjacent BL can be used as an input to an unbalanced sense amplifier.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A read only memory (ROM) having high operational speed with reduced leakage and low power consumption, the ROM comprising:
   a plurality of bit lines;
   a plurality of word lines;
   a plurality of column select lines; and
   a plurality of transistors operatively coupled to the bit lines, the word lines and the column select lines, each one of the transistors comprising:
      a source terminal connected to a selected one of the word lines;
      a drain terminal connected to a selected one of the bit lines; and
      a gate terminal connected to a selected one of the column select lines, wherein the word line is selectively connected to a ground voltage when the word line is selected, and wherein the column select line is connected to a supply voltage.

2. The ROM according to claim 1, wherein the plurality of transistors comprises a metal oxide semiconductor (MOS) transistor.

3. The ROM according to claim 1, wherein the plurality of transistors comprises a matrix of metal oxide semiconductor (MOS) transistors.

4. The ROM according to claim 1, wherein the bit lines provide read bit lines for a first half row.

5. The ROM according to claim 4, wherein the bit lines provide reference bit lines for a second half row to enhance the operational speed.

6. The ROM according to claim 1, wherein the transistors reduce cross talk between the bit line and the column select line.

7. The ROM according to claim 1, wherein any unselected ones of the word lines are kept at the supply voltage.

8. A method of building a read only memory (ROM) having a high operational speed with reduced leakage and low power consumption, the method comprising:
- coupling a plurality of transistors to a plurality of word lines, a plurality of bit lines and a plurality of column select lines in the ROM to reduce one or more cross talks;
- connecting one of the word lines to a source of a selected one of the transistors;
- connecting one of the bit lines to a drain of the selected transistor; and
- connecting one of the column select lines to a gate of the selected transistor, such that the word line is selectively connected to a ground voltage when the word line is selected, and wherein the column select line is connected to a supply voltage.

9. The method according to claim 8, wherein the plurality of transistors comprises a metal oxide semiconductor (MOS) transistor.

10. The method according to claim 8, wherein the plurality of transistors comprises a matrix of metal oxide semiconductor (MOS) transistors.

11. The method according to claim 8, wherein the bit lines provide read bit lines for a first half row.

12. The method according to claim 11, wherein the bit lines provide reference bit lines for a second half row to enhance the operational speed.

13. The method according to claim 8 further comprising:
reducing cross talk by the transistors between the bit line and the column select line.

14. The method according to claim 8, wherein any unselected ones of the word lines are kept at the supply voltage.

15. A read only memory (ROM) comprising:
- a plurality of bit lines;
- a plurality of word lines;
- a plurality of column select lines; and
- a plurality of transistors operatively coupled to the bit lines, the word lines and the column select lines, wherein each one of the transistors have a source terminal connected to a selected one of the word lines, a drain terminal connected to a selected one of the bit lines, a gate terminal connected to a selected one of the column select lines,
wherein the word line is selectively connected to a ground voltage when the word line is selected, and wherein the column select line is connected to a supply voltage to provide high operational speed with reduced leakage and low power consumption.

16. The ROM according to claim 15, wherein the plurality of transistors comprises a metal oxide semiconductor (MOS) transistor.

17. The ROM according to claim 15, wherein the bit lines provide read bit lines for a first half row.

18. The ROM according to claim 17, wherein the bit lines provide reference bit lines for a second half row to enhance the operational speed.

19. The ROM according to claim 15, wherein the transistors reduce cross talk between the bit line and the column select line.

20. The ROM according to claim 15, wherein any unselected ones of the word lines are kept at the supply voltage.

* * * * *

UNITED STATES PATENT AND TRADEMARK OFFICE
CERTIFICATE OF CORRECTION

| | | |
|---|---|---|
| PATENT NO. | : 7,729,155 B2 | Page 1 of 1 |
| APPLICATION NO. | : 11/648105 | |
| DATED | : June 1, 2010 | |
| INVENTOR(S) | : Luthra | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 249 days.

Signed and Sealed this
Eighteenth Day of January, 2011

David J. Kappos
*Director of the United States Patent and Trademark Office*